(12) United States Patent
Noquil et al.

(10) Patent No.: US 6,645,791 B2
(45) Date of Patent: Nov. 11, 2003

(54) SEMICONDUCTOR DIE PACKAGE INCLUDING CARRIER WITH MASK

(75) Inventors: Jonathan A. Noquil, Suigao del Sur (PH); Maria Cristina B. Estacio, Cebu (PH)

(73) Assignee: Fairchild Semiconductor, South Portland, ME (US)

( * ) Notice: Subject to any disclaimer, the term of this patent is extended or adjusted under 35 U.S.C. 154(b) by 0 days.

(21) Appl. No.: 09/841,333

(22) Filed: Apr. 23, 2001

(65) Prior Publication Data

US 2002/0155642 A1 Oct. 24, 2002

(51) Int. Cl.[7] .......................... H01L 21/44; H01L 21/48; H01L 21/50
(52) U.S. Cl. ......................................... 438/108; 438/109
(58) Field of Search .................. 438/106, 108; 257/678, 738

(56) References Cited

U.S. PATENT DOCUMENTS

| 6,133,634 | A | 10/2000 | Joshi | |
|---|---|---|---|---|
| 6,201,305 | B1 | 3/2001 | Darveaux et al. | |
| 6,284,566 | B1 * | 9/2001 | Lee et al. | 438/106 |
| 6,392,290 | B1 * | 5/2002 | Kasem et al. | 257/678 |
| 2001/0013654 | A1 * | 8/2001 | Kalidas et al. | 257/738 |
| 2002/0009826 | A1 * | 1/2002 | Chien | 438/106 |

* cited by examiner

Primary Examiner—William David Coleman
(74) Attorney, Agent, or Firm—Townsend, Townsend & Crew LLP

(57) ABSTRACT

A carrier for use in a semiconductor die package is disclosed. In one embodiment, the carrier includes a die attach region and an edge region. A solder mask is on the edge region.

18 Claims, 8 Drawing Sheets

SEMICONDUCTOR DIE PACKAGE INCLUDING CARRIER WITH MASK

BACKGROUND OF THE INVENTION

Silicon process technology has advanced significantly in the past decade. However, for the most part, decades-old package technology is often used to package semiconductor dies. In a conventional packaging process, gold wires couple a semiconductor die and a lead frame together in a semiconductor die package. Leads in the lead frame are coupled to the conductive lands on a circuit substrate such as a printed circuit board (PCB).

Advances in semiconductor processing technology, however, have made the parasitics associated with conventional packages more of a performance-limiting factor. This is particularly true in the case of power switching devices where, as in the case of power metal oxide field effect transistors (MOSFETs), the on-resistance of these devices continues to decrease. For example, the parasitic resistance introduced by the bond wires and the lead frame in conventional packages becomes much more significant for such high current devices as power MOSFETs. Furthermore, the continuous shrinking of geometries and the resulting increase in chip densities increases the demand for semiconductor packages with lead counts higher than that offered by the conventional packaging techniques.

Ball grid array and flip chip technologies were developed to address some of these demands. Both of these technologies provide for a more direct connection between the silicon die and a circuit substrate as well as providing for higher interconnect densities.

In one method for fabricating a flip chip type semiconductor die package, a vertical MOSFET device is formed in a thick semiconductor wafer (e.g., 15 to 23 mils thick) (1 mil=$\frac{1}{1000}^{th}$ of an inch). A solder mask with apertures is formed on the semiconductor wafer and solder balls are deposited in the apertures. The solder balls are reflowed so that they bond to the semiconductor wafer. The semiconductor wafer is then subjected to a lapping process where the wafer is thinned to, for example, 8 mils. The semiconductor wafer is then diced to form individual semiconductor dies.

A carrier for the die package is also prepared. Solder balls are deposited on the carrier. To help balls stay in place, the solder balls are partially reflowed and subsequently bond to the carrier. A "partial" reflow process is performed at a lower temperature and/or in less time than a full reflow process. A full reflow process is not performed, since performing a full reflow process causes the solder balls to collapse and lose their shape. Once the semiconductor die and the carrier are formed, the semiconductor die can be attached to the carrier using a die attach material. The carrier and the semiconductor die can then be flipped over and then mounted to a circuit substrate such as a printed circuit board (PCB).

A number of improvements could be made to this method. For example, using two separate steps to place solder balls on the semiconductor die and the carrier increases the cost and the processing time for the package. In addition, using two steps to place solder balls on the semiconductor die and the carrier can increase the likelihood that the bumps on the two components will not be coplanar. If the ends of the solder balls on the two components are not coplanar, then all of the solder balls may not all contact the conductive lands on a circuit substrate. If this happens, interconnects between the semiconductor die and the circuit substrate may not be formed. Moreover, because the solder balls on the carrier are partially reflowed, the bonds formed between the solder balls and the carrier are weaker than if a full reflow process were performed. It would be desirable to increase the strength of the bonds formed between the solder balls and the carrier in order to improve the reliability of the formed semiconductor die package.

Embodiments of the invention address these and other problems.

SUMMARY OF THE INVENTION

One embodiment of the invention is directed to a method for forming a semiconductor die package, the method comprising: a) forming a carrier having a die attach region and an edge region, and a solder mask having one or more apertures on the edge region; b) attaching a semiconductor die to the die attach region of the carrier; and c) depositing solder in the one or more apertures in the solder mask.

Another embodiment of the invention can be directed to a method for forming a semiconductor die package, the method comprising: a) forming a carrier having a die attach region and a plurality of edge regions disposed around and at least partially defining the die attach region, wherein each edge region has a surface that is elevated with respect to the die attach region, and a first solder mask disposed on at least one of the plurality of edge regions; b) attaching a semiconductor die comprising a vertical power metal oxide field effect transistor (MOSFET) device having a source region, a drain region, and a gate region to the die attach region, and second solder mask with apertures, wherein the drain region of the semiconductor die is proximate to the die attach region and the source region is distal to the die attach region; and c) depositing solder in the apertures of the first solder mask and the apertures in the second solder mask substantially simultaneously.

Another embodiment of the invention is directed to a carrier for use in a semiconductor die package, the carrier comprising: a) a die attach region; b) an edge region; and c) a solder mask on the edge region, wherein the solder mask includes one or more apertures.

Another embodiment of the invention is directed to a semiconductor die package comprising: a) a carrier comprising a die attach region and a plurality of edge regions that are elevated with respect to and at least partially define the die attach region, and a first solder mask having one or more apertures disposed on at least one of the plurality of edge regions; b) a semiconductor die having a source region, a gate region, a drain region, and a second solder mask with one or more apertures, wherein the semiconductor die is on the die attach region and wherein the drain region is proximate to the die attach region and the source region is distal to the die attach region; and c) solder disposed within apertures in the first solder mask and the second solder mask.

These and other embodiments are described in greater detail below.

BRIEF DESCRIPTION OF THE DRAWINGS

FIGS. 8(a), 8(b), and 8(c) show perspective views of semiconductor die package components. They are assembled together to form a semiconductor die package. In the illustrated process, the semiconductor die does not need to be bumped before being attached to the carrier. Rather, solder balls can be deposited simultaneously on the semiconductor die and the carrier.

DESCRIPTION OF THE SPECIFIC EMBODIMENTS

One embodiment of the invention is directed to a carrier comprising a die attach region and a plurality of edge regions. Each edge region can have a surface that is elevated with respect to the die attach region. Each edge region can also partially define the die attach region. The carrier may also comprise a base metal and one or more layers of material on the base metal. A first solder mask having one or more apertures is disposed on an edge region.

A semiconductor die is attached to the die attach region of the carrier. In some embodiments, the semiconductor die may have a MOSFET with a source region, a gate region, and a drain region. When the semiconductor die is attached to the die attach region of the carrier, the drain region is proximate to the die attach region and the source region is distal to the die attach region.

A second solder mask can be disposed on the semiconductor die. The second solder mask may comprise, for example, a silicon nitride layer with apertures. Metal connecting to the gate region or the source region may be exposed through the apertures in the second solder mask. A plurality of solder deposits are disposed within the one or more apertures in the first solder mask and the second solder mask. In some embodiments, the solder deposits can be solder balls.

Figure 1:
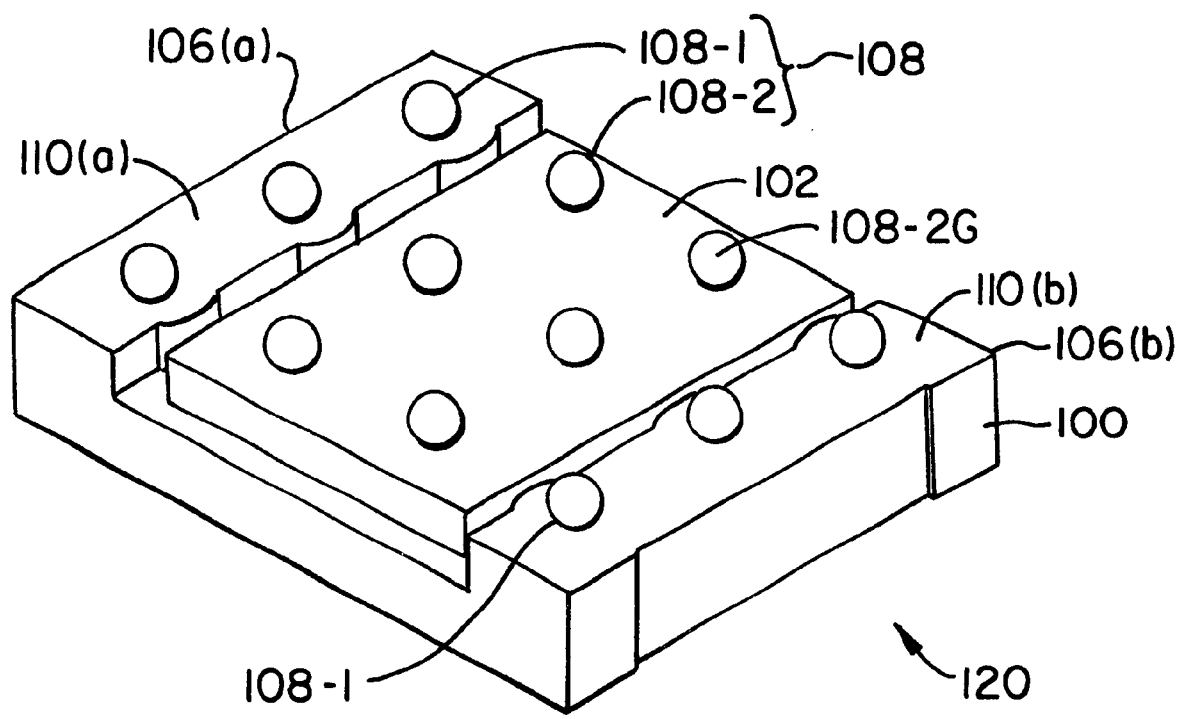
FIG. 1 shows a perspective view of a semiconductor die package according to an embodiment of the invention.

FIG. 1 shows a perspective view of an exemplary semiconductor die package 120 according to an embodiment of the invention. The semiconductor die package 120 has a carrier 100 and a semiconductor die 102 disposed on the carrier 100. The semiconductor die 102 can comprise a semiconductor material such as silicon. An array of solder balls 108 is disposed on the semiconductor die 102 and two edge regions 106(a), 106(b) in the carrier 100. In some embodiments, the carrier 100 can be considered a lead frame.

The carrier 100 can be both thermally and electrically conductive. In this regard, the carrier 100 can comprise a body comprising a base metal such as copper or aluminum. The base metal may have one or more layers of material coated on it. For instance, the one or more layers of material may comprise any suitable underbump metallurgy combination. For example, at least one of an adhesion layer, a barrier layer, a solder wettable layer, and an oxidation barrier layer may be formed on the base metal. Illustratively, the carrier base metal may comprise copper. The base metal may be coated with a nickel solder wettable layer and then a palladium or gold oxidation barrier layer.

The semiconductor die 102 may comprise, for example, a vertical MOSFET device. The vertical MOSFET device has a source region, a drain region, and a gate region. The source region and the drain region are at opposite sides of the semiconductor die 102 so that current flows vertically through the semiconductor die 102. A solder mask comprising, for example, silicon nitride may be formed over metal regions in the semiconductor die 102. Apertures in the solder mask can be disposed over the metal regions so that solder deposits in the apertures contact the metal regions and communicate with the source and drain regions.

The carrier 100 shown in FIG. 1 includes two edge regions 110(a), 110(b) that are disposed on opposite sides of the semiconductor die 102. The edge regions 110(a), 110(b) have surfaces that are elevated above the die attach region of the carrier 100. In this example, both edge regions 110(a), 110(b) at least partially define the die attach region of the carrier 100. As shown in FIG. 1, when the semiconductor die 102 is disposed on the die attach region between the edge regions 110(a), 110(b), the upper surfaces of the edge regions 110(a), 110(b) are substantially coplanar with the upper surface of the semiconductor die 102. Solder masks disposed on these surfaces can also be substantially coplanar.

One solder mask 110(a) is disposed on one edge region 106(a), while another solder mask 110(b) is disposed on another edge region 106(b). Each solder mask 110(a), 110(b) has one or more apertures. Each solder mask preferably comprises a material that has a melting temperature that is higher than the reflow temperature of the solder that deposited within its apertures. Preferably, the solder mask comprises a polymeric material such as polyimide. The solder mask 110 helps to keep solder deposits (e.g., solder balls) confined to predetermined locations on the carrier 110.

In this example, the solder ball array 108 is divided into two groups; a first outer array of solder balls 108-1 that connects to carrier edge regions 106 and an internal array of solder balls 108-2 connecting to the surface of the semiconductor die 102. The solder balls 108-1 disposed in apertures in the solder masks 110(a), 110(b) are substantially coplanar with the solder balls 108-2 on the semiconductor die 102. Although an array 108 of solder balls is shown in FIG. 1, the solder deposited within the apertures of the solder mask 110 may be, for example, columns or cones of solder.

If the semiconductor die comprises a power MOSFET device, the solder balls 108-1 provide the connection to the drain terminal of the device. Other solder balls 108-2 provide the connection to the source and gate terminals of the device. In FIG. 1, a corner solder ball 108-2G is dedicated for the gate terminal and the remaining solder balls in the internal array 108-2 provide for a distributed, low resistance connection to the source terminal of the MOSFET. The combination of a highly conductive carrier 100 and the array of solder balls 108-1 plus a distributed array of solder balls 108-2 across the surface of the semiconductor die reduces the length of the current path through the metal connections.

Figure 2:
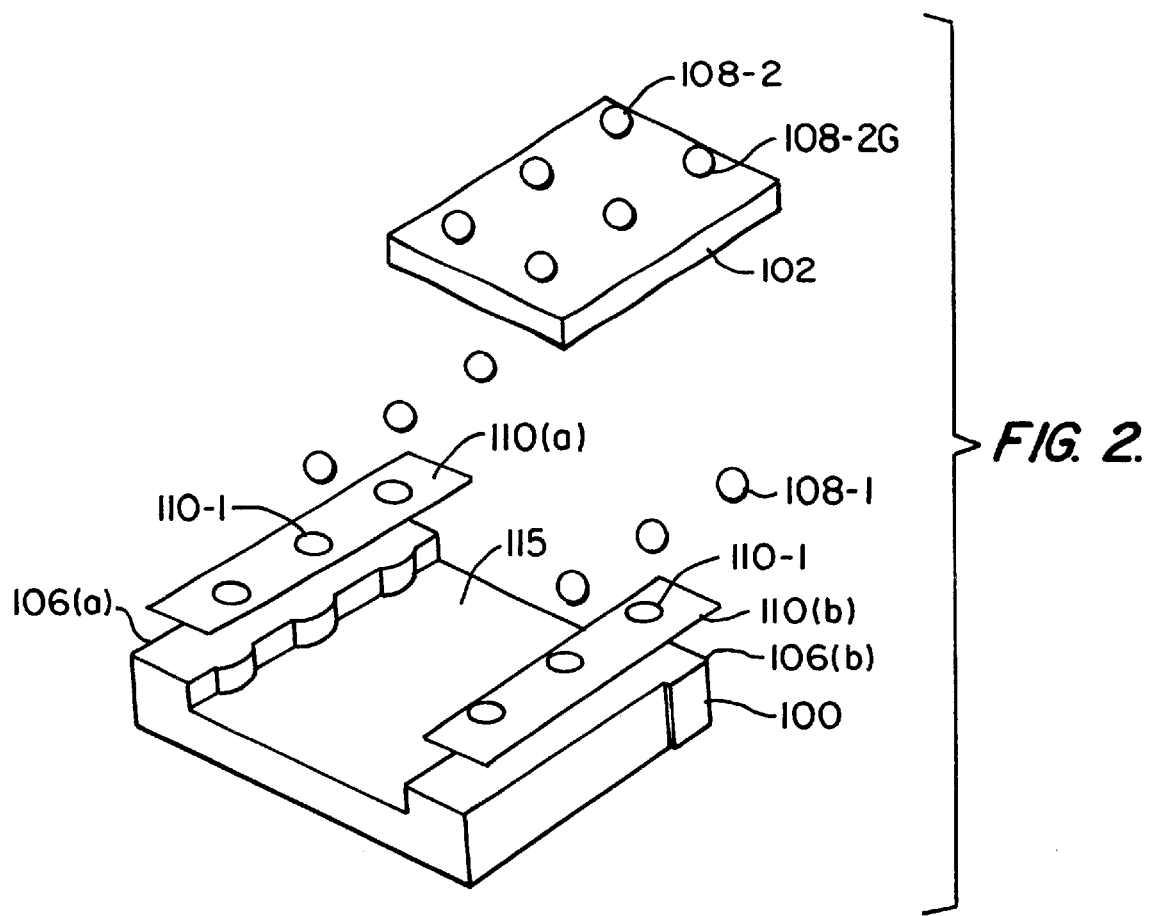
FIG. 2 is an exploded view of the semiconductor die package shown in FIG. 1.

FIG. 2 is an exploded view of the semiconductor die package shown in FIG. 1. In FIG. 2, like elements as shown in FIG. 1 are designated with like numerals. However, in this Figure, the die attach region 115 of the carrier 100 is more clearly visible. As shown in FIG. 2, the die attach region 115 is between the two edge regions 106(a), 106(b) in the semiconductor die package. Although two edge regions are around the die attach region 115 in this example, in other embodiments, the carrier 100 may have one, three, four etc. distinct edge regions. For example, the carrier 100 may have four edge regions that form a square recess (not shown). A semiconductor die may then inserted within the square recess.

The semiconductor die 102 can be attached to the die attach region 115 using any one of a variety of well known die attach materials such as conductive epoxies, and soft or hard solder materials. After bonding the semiconductor die 102 to the carrier 100, the bonding layer of epoxy or solder may form a bond line. The height of each of the edge regions 106 (relative to the die attach region) is substantially equal to the thickness of semiconductor die 102 plus the thickness of die attach bond line 104. This ensures that the outer surface of die 102 and the edge regions 106 of carrier 100 surrounding the semiconductor die 102 form a uniform plane.

The semiconductor die 102 and the carrier 100 can have any suitable dimensions. For example, a typical semiconductor die may be, for example, about 0.008 inches thick (or less) and the thickness of carrier 100 at the bottom of the recess may be, for example, about 0.008 inches thick (or less). This results in an exemplary package that is about 0.4 millimeters thick (and about 0.6 millimeters thick with the solder balls) in some embodiments.

The semiconductor die packages according to embodiments of the invention are particularly well suited for discrete products with high heat dissipation such as power switching devices (e.g., power MOSFETs) where an electrical connection to the back side of the die (MOSFET drain terminal) is required. By using a conductive material such as copper for the carrier 100, the semiconductor die packages according to embodiments of the invention provide for a very low resistance, compact connection between the back side of the die (the drain terminal of the power MOSFET) and a circuit substrate.

It is to be understood that a conductive carrier 100 for power MOSFET applications is used herein for illustrative purposes only, and that the carrier 100 may be made of a dielectric material such as dielectric ceramic material. Selective contact to the back side of the die is still possible with selective conductive traces through the ceramic carrier.

Methods for forming the semiconductor die package shown in FIGS. 1 and 2 can be described with reference to FIGS. 3 to 8(c).

Figure 3:
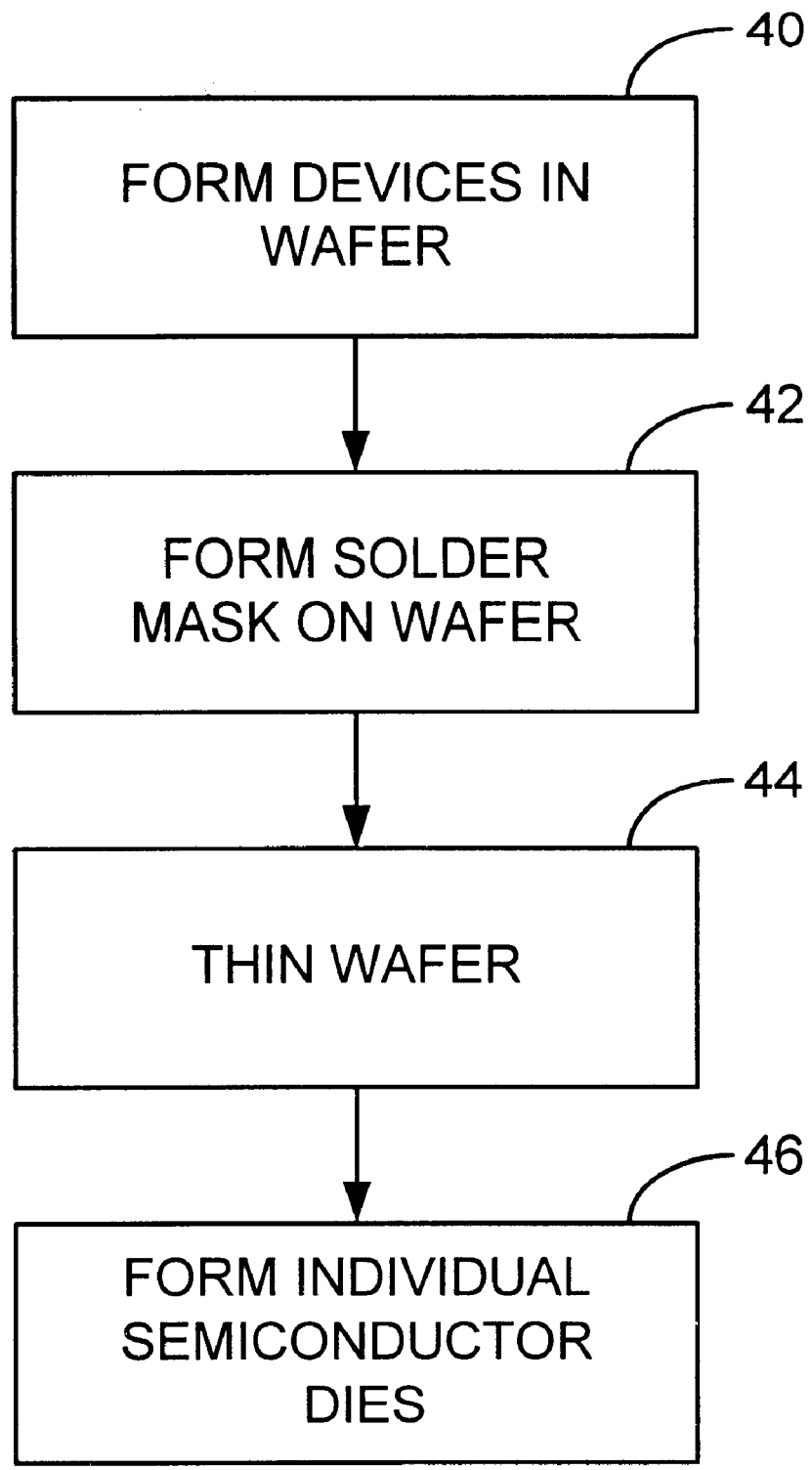
FIG. 3 shows a flowchart for a process sequence for forming semiconductor dies according to an embodiment of the invention.

FIG. 3 shows a flowchart of a process for forming the individual semiconductor dies that will be packaged. First, active or passive devices are formed in a semiconductor wafer (step 40). An example of an active device is a vertical MOSFET device. The MOSFET device may have a source region and a gate region (a planar or trenched gate) at one surface of the wafer and a drain region at the other surface of the wafer. The semiconductor wafer may have any suitable thickness including a thickness of about 15 to about 23 mils.

Once the devices are formed in the semiconductor wafer, a solder mask with apertures is formed on the semiconductor wafer using conventional processes (step 42). The solder mask may comprise, for example, a dielectric material such as silicon nitride, glass, or silicon dioxide. Apertures in the solder mask may be disposed over metal regions that are respectively coupled to the source region(s) and the gate region(s) of the MOSFET device in the semiconductor wafer. Solder disposed in the apertures of the solder mask can contact the metal regions.

Figure 4:
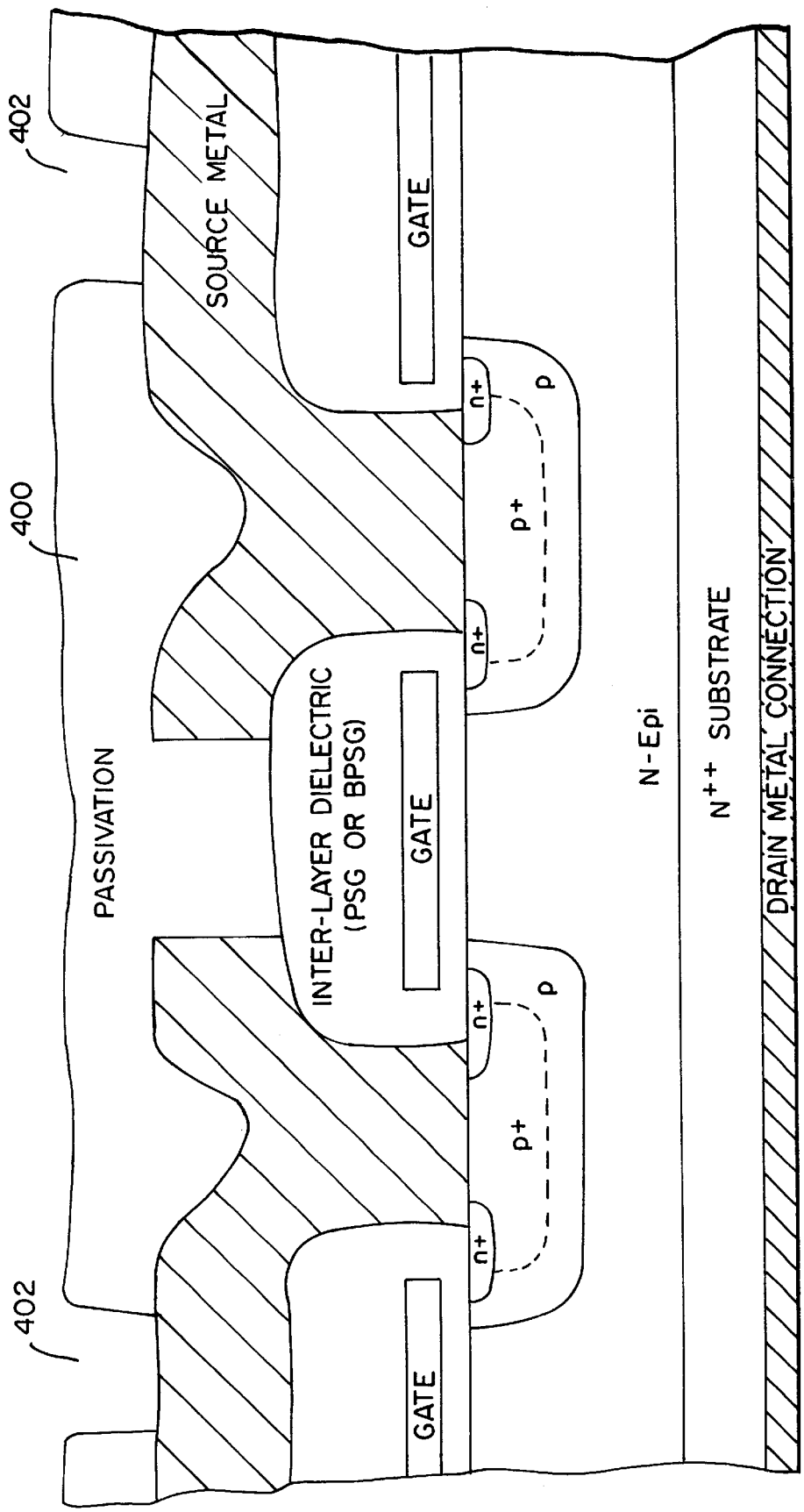
FIG. 4 shows a cross-sectional view of a vertical power MOSFET with a solder mask.

For instance, FIG. 4 shows a portion of a semiconductor wafer after a solder mask 400 is formed on it. As shown, a source metal layer contacts n+ source regions. A drain metal connection is at the opposite side of the semiconductor wafer as the n+ source regions. A passivation layer 400 having a number of apertures may be formed over the source metal layer and may function as a solder mask Apertures 402 in the solder mask 400 expose the source metal underneath the solder mask 400. Consequently, solder that is deposited within the apertures 402 can contact the source metal so that external contacts to the n+ source regions of the MOSFET device can be made.

After forming the solder mask on the semiconductor wafer, the semiconductor wafer can be subjected to a thinning process (step 44). In the thinning process, the back surface of the semiconductor wafer can be lapped according to conventional processes. The semiconductor wafer may be thinned until it is about 4 to about 8 mils thick. Thinning the semiconductor wafer can improve the heat dissipation properties of semiconductor dies in the wafer. Heat can dissipate from thinner semiconductor dies more quickly than thicker semiconductor dies. Thinning also makes it easier to dice the wafer to form the individual semiconductor dies.

After thinning the semiconductor wafer, the semiconductor wafer can be diced to form the individual semiconductor dies (step 46). Any suitable dicing process may be used. Exemplary dicing processes include wafer sawing, laser cutting, etc. Once the individual semiconductor dies are formed, they can be packaged.

Figure 5:
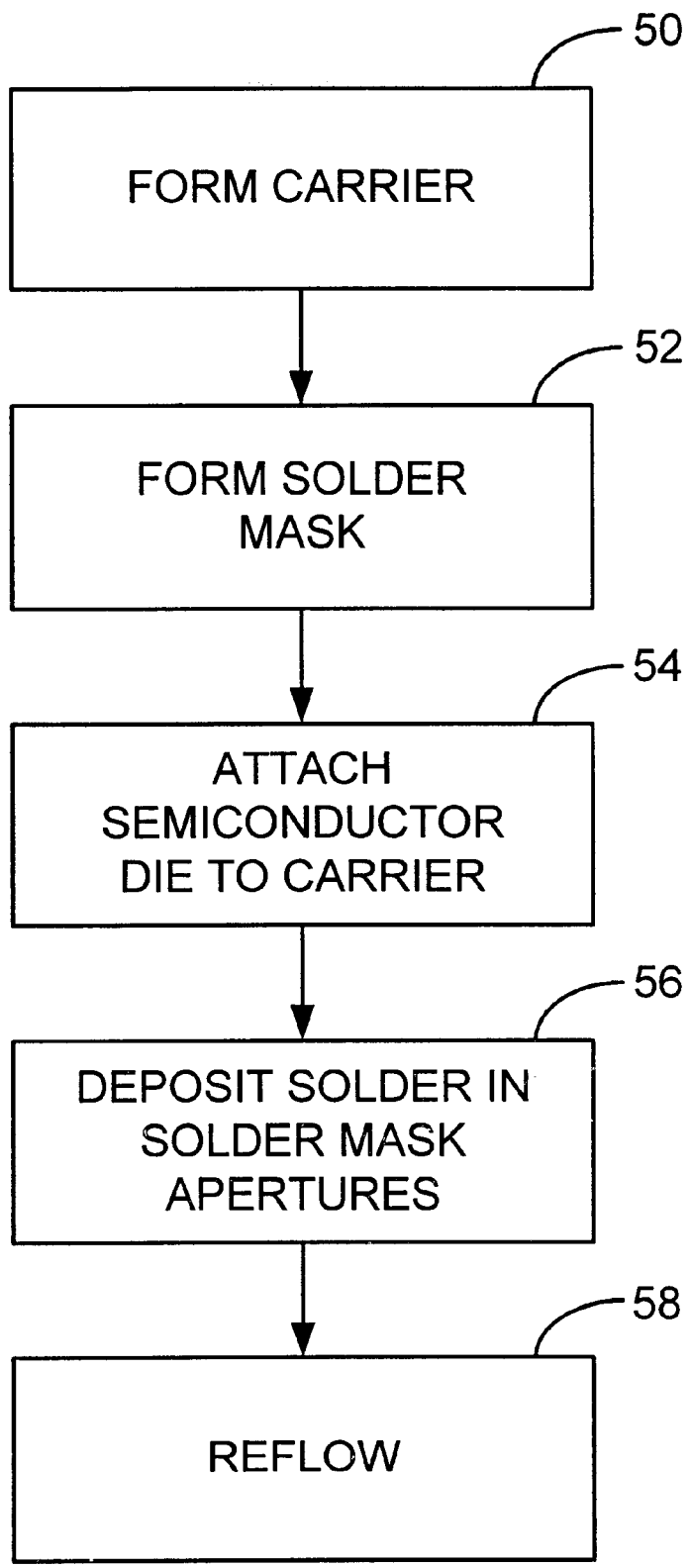
FIG. 5 shows a flowchart for a process sequence for assembling a semiconductor die package according to an embodiment of the invention.

FIG. 5 shows a flowchart for a process for forming the semiconductor die packages according to embodiments of the invention. First, a carrier is formed (step 50). The carrier can be formed, for example, by stamping a metal sheet to form a die attach region and edge regions in the metal sheet. In an exemplary stamping process, a flat metal sheet may be placed in a stamping apparatus to stamp the metal sheet and form the die attach region of the carrier.

Then, a solder mask can be formed on the metal sheet and on an edge region of the carrier (step 52). The solder mask may comprise a heat resistant polymeric material such as polyimide. The solder mask is preferably formed using a photolithography process. The steps used in exemplary photolithography processes are described in further detail below. The solder masks may have any suitable form. For example, in some embodiments, a solder mask on the carrier may simply be a ring of material that confines a solder deposit to a predetermined location. In other embodiments, the solder mask may be a layer with two or more apertures in it.

Before or after the solder mask is formed, one or more additional layers may be formed on the base metal of the carrier. The one or more additional layers may include adhesion layers, diffusion barriers, solder wettable layers, and oxidation barrier layers. Examples of materials that can be used in the one or more layers include Ni, Pd, Cr, Cu, Au, and alloys thereof. Any suitable process including electroplating, sputtering, electroless plating, etc. may be used to form the one or more additional layers of material on the base metal of the carrier.

Figure 6A:
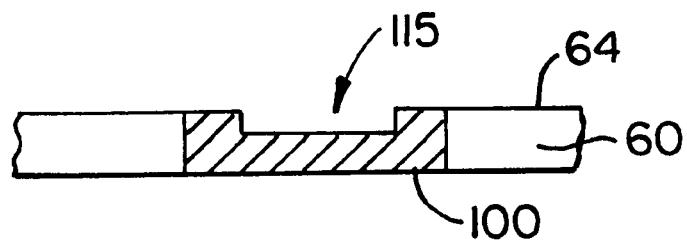
FIGS. 6(a)–6(d) show cross-sections of a carrier in a process embodiment for forming a solder mask on the carrier.

The solder masks can be formed on the base metal of a carrier after forming various layers on the base metal. For example, in FIG. 6(a), a metal sheet 60 may comprise a die attach region 115 that partially defines a recess in the metal sheet 60. The die attach region 115 may have been previously formed by stamping. One or more layers 64 of material may be deposited on the metal sheet 60. The layers may comprise, for example, a solder wettable layer comprising nickel and an oxidation barrier layer comprising palladium. In FIGS. 6(a) to 6(d), the outline of the carrier 100 that will eventually be formed from the metal sheet 60 is shown by cross-hatches. The cross-hatched region can be cut out at a later time. As shown in FIG. 6(a), one side of the metal sheet 60 can be coated with one or more layers of material 64. In other embodiments, both sides of the metal sheet 60 can be coated with one or more layers of material.

Figure 6B:
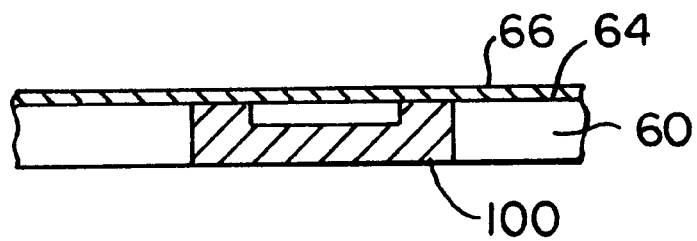

In FIG. 6(b), a photosensitive layer 66 may be deposited on the metal sheet 60. The photosensitive layer 66 may comprise a positive or a negative photosensitive material. Any suitable process may be used to deposit the photosensitive layer 66. For example, in some embodiments, the photosensitive layer 66 can be laminated to the metal sheet 60 or may be printed on the metal sheet 60. Any suitable material can be used in the photosensitive layer 66. Preferably, the photosensitive layer 66 comprises a polyimide or polyimide precursor. Many polyimides do not melt or decompose at high temperatures and can thus be left on the metal sheet 60 during a reflow process.

Figure 6C:
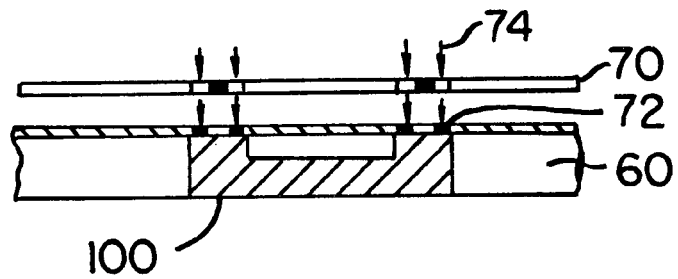

Referring to FIG. 6(c), a photomask 70 is disposed over the photosensitive layer 66. The photomask 70 includes a number of regions that are transparent to radiation and a number of regions that are not transparent to radiation. The photosensitive layer 66 can thus be irradiated with a pattern of radiation passing through the photomask 70. Radiation 74 can pass through the photomask 70 to render certain portions 72 of the photosensitive layer 66 insoluble to a developing solution. In some embodiments, portions of the photosensitive layer 66 that are not irradiated can be developed in the developing solution.

Figure 6D:
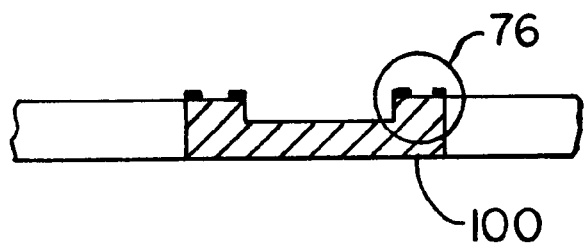

As shown in FIG. 6(d), after being irradiated, the photosensitive layer 66 can be exposed to a developing solution to remove the non-irradiated portions of the photosensitive layer 66. After developing, a solder mask 76 containing apertures can be disposed on the metal sheet 60. Before or after the metal sheet 60 is cut to separate the carrier 100 from other portions of the metal sheet 60, a semiconductor die (not shown) can be bonded to the die attach region 115 of the carrier 100.

Figure 7A:
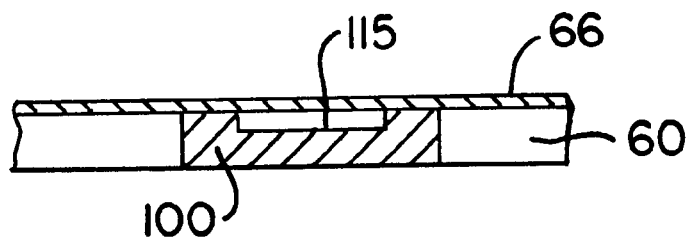
FIGS. 7(a)–7(d) show cross-sections of a carrier in another process embodiment for forming a solder mask on the carrier.

In other embodiments, a solder mask can be formed on the base metal of a carrier before forming various underbump metallurgy layers on the carrier. As shown in FIG. 7(a), a photosensitive layer 66 can be deposited onto a metal sheet 60 in the same or different manner as previously described. The metal sheet 60 has a recess that is partially defined by a die attach region 115. Prior to receiving the photosensitive layer 66, the metal sheet 60 may be uncoated.

Figure 7B:
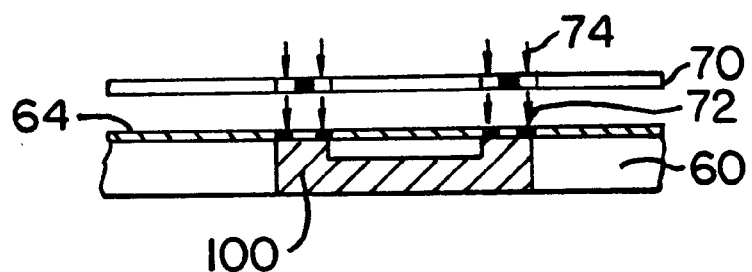
Figure 7C:
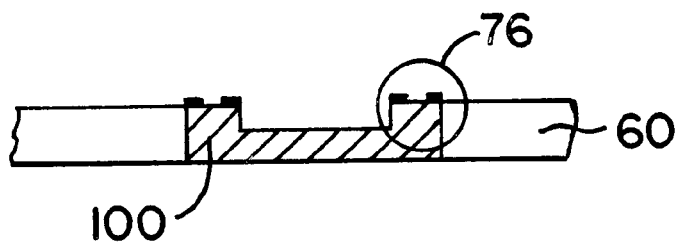

Referring to FIG. 7(b), after the photosensitive layer 66 is on the metal sheet 60, it can be irradiated in the same or different manner as previously described. As shown in FIG. 7(c), after irradiating the photosensitive layer 66, the photosensitive layer 66 can be developed to leave a solder mask 76 with one or more apertures.

Figure 7D:
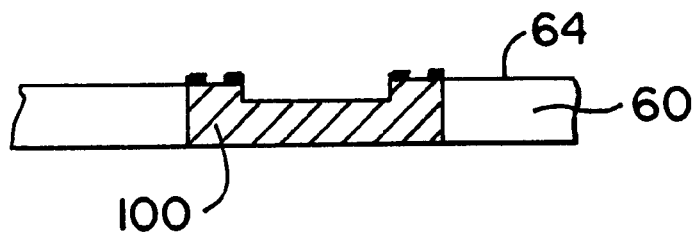

Referring to FIG. 7(d), after forming the solder mask 76, one or more layers of material may be deposited on the metal sheet 60. The one or more layers 64 of material may comprise the same or different layers, and may be deposited in the same or different manner, as described above. In this example, at least a portion of the one or more layers 64 of material are deposited within the apertures of the solder mask 76. Before or after the metal sheet 60 is cut to separate the carrier 100 from other portions of the metal sheet 60, a semiconductor die (not shown) can be bonded to the die attach region 115 of the carrier 100.

Once the carrier and the semiconductor die are formed, the semiconductor die can be attached to the carrier. For example, referring to FIG. 8(a), the semiconductor die 102 may be attached to the die attach region 115 using solder or a conductive adhesive (e.g., a conductive epoxy). Solder masks 110(a), 110(b) with apertures 110-1 may be disposed on the edge regions of the carrier 100. A second solder mask 150 with apertures 150-1 can be in the semiconductor die 102.

Referring to FIG. 8(b), after the semiconductor die 102 is attached to the carrier 100, an array of solder balls 108 may be deposited in the apertures 110-1 in the first solder mask 110 on the carrier 100 and in the apertures 150-1 in the second solder mask 150 in the semiconductor die 102. In some embodiments, the solder balls 108 can alternatively be solder deposits such as solder columns or conical solder deposits. The solder balls 108 (or other type of solder deposit) used in embodiments of the invention may comprise any suitable material including Pb—Sn, In—Sn, etc. with atomic elements in any suitable atomic or weight proportions (e.g., 63/37, 95/5).

In the illustrated embodiment, the regions of the semiconductor die 102 exposed through the apertures 150-1 are solderable to enable simultaneous ball attach on the semiconductor die 102 and carrier 100. The regions within or under the apertures 150-1 may contain aluminum and any suitable underbump metallurgy layers (such as those described above). For example, Ni—Au can be sputtered or electrolessly plated within or under the apertures 150-1 on aluminum in the semiconductor die 102 to make the regions exposed by the apertures 150-1 solderable.

In some embodiments, the solder balls can be placed within the apertures of the solder masks on the semiconductor die 102 and on the edge regions of the carrier 100 by a pick and place process. Alternatively, solder can be deposited in the apertures of the solder masks using, for example, a screening process, electoplating process, or any other suitable process. For example, in a screening process, a solder stencil can be placed over the semiconductor die 102 and the edge regions of the carrier 100. Apertures in the stencil can correspond to the apertures in the first and the second solder masks. Solder paste can be screened or into the apertures of the solder stencil and into the apertures in the first and the second solder masks. Regardless of the particular solder deposition method used, the solder is preferably deposited in the apertures in the first and the second solder masks substantially simultaneously.

Figure 8C:
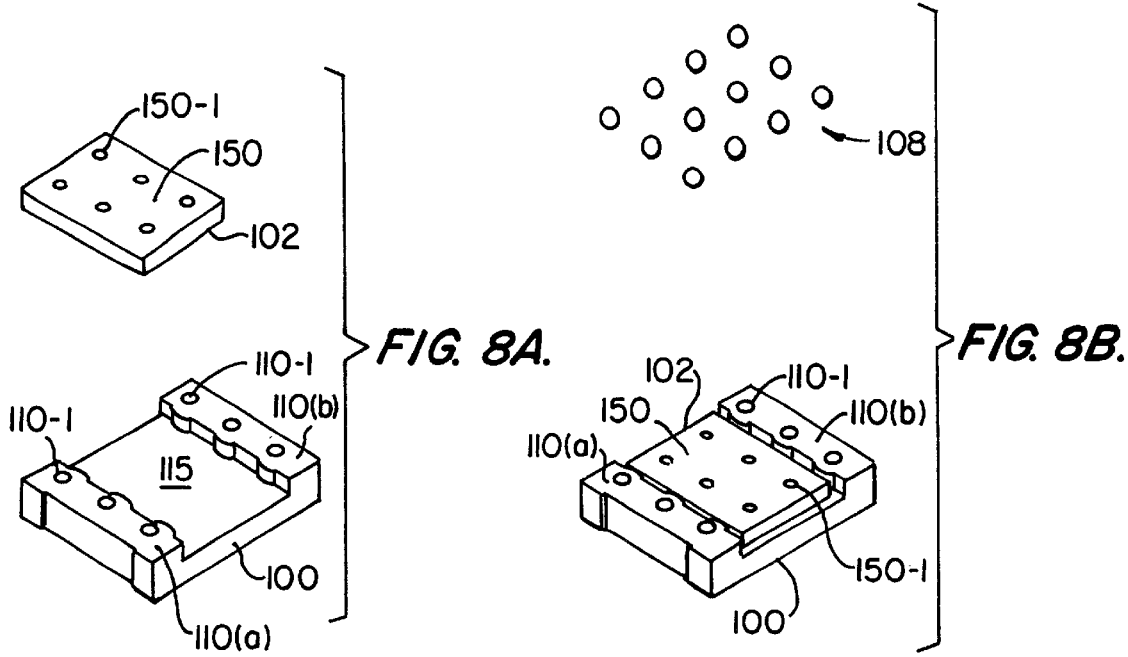
Figure 8C:
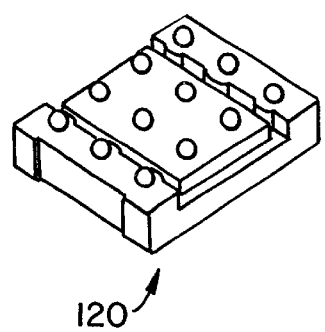

After depositing solder within the apertures first and second solder masks, the solder can be reflowed within the apertures in the first and the second solder masks. A full reflow process can be performed. In a typical reflow process, the solder can be heated above 150° C. for about 15 minutes or more. The particular reflow conditions will, however, depend on the particular solder being used, the particular package being formed, etc. The resulting semiconductor die package 120 can be as shown in FIG. 8(c). The semiconductor die package 120 shown in FIG. 8(c) can then be flipped over and mounted on the conductive lands of a circuit substrate (e.g., a circuit board).

Embodiments of the invention have a number of advantages. For example, in embodiments of the invention, solder can be deposited on the carrier and the semiconductor die in a single process step. Accordingly, solder contacts in the semiconductor die package can be made quickly and efficiently. Also, embodiments of the invention reduce the likelihood that the solder deposits will not be coplanar in the formed die package, since all solder deposits in the package are processed in the same way and at the same time. In addition, in embodiments of the invention, a solder mask is used on the carrier so that a full reflow process can be performed on the solder on the carrier. The solder mask confines the deposited solder so that the solder deposits (e.g., solder balls) in the solder mask apertures do not substantially deform during reflow. Thus, stronger bonds between the solder and the carrier can be formed than if the solder on the carrier is subjected to a partial reflow process. Moreover, when the package is mounted on a circuit substrate, the solder mask(s) on the carrier need not contact the circuit substrate. Thus, if the circuit substrate is disposed on a heater in a reflow process, the heat passing to the solder mask(s) on the carrier is minimized due to the gap between the solder mask and the circuit substrate. Consequently, any possible thermal degradation of the solder mask(s) is also minimized.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A method for forming a semiconductor die package, the method comprising:
   a) forming a carrier having a die attach region and an edge region, and a solder mask having one or more apertures on the edge region;
   b) attaching a semiconductor die to the die attach region of the carrier; and
   c) depositing solder in the one or more apertures in the solder mask wherein a) comprises
      i) depositing a photosensitive layer on the edge region, and
      ii) forming the solder mask from the deposited photosensitive layer.

2. The method of claim 1 wherein c) comprises:
   depositing one or more solder balls in the one or more apertures in the solder mask.

3. The method of claim 1 wherein the solder mask on the edge region is a first solder mask and wherein the semiconductor die includes a second solder mask with apertures, and wherein the method further comprises:
   d) depositing solder within apertures of the second solder mask on the semiconductor die.

4. The method of claim 1 wherein the solder mask on the edge region is a first solder mask, and wherein the semiconductor die includes a second solder mask with apertures, and wherein the method further comprises:
   d) depositing solder within apertures of the second solder mask in the semiconductor die at substantially the same time as solder is deposited in the apertures of the first solder mask.

5. The method of claim 4 wherein the first solder mask comprises polyimide.

6. A method for forming a semiconductor die package, the method comprising:
   a) forming a carrier having a die attach region and an edge region, and a solder mask having one or more apertures on the edge region;
   b) attaching a semiconductor die to the die attach region of the carrier; and
   c) depositing solder in the one or more apertures in the solder mask,
   wherein the carrier comprises a base metal and wherein a) comprises
      i) forming one or more layers of material on the base metal,
      ii) depositing a photosensitive layer on the edge region, and
      iii) forming the solder mask from the deposited photosensitive layer.

7. The method of claim 6 wherein i) is performed after ii) and ii).

8. A method for forming a semiconductor die package, the method comprising:
   a) forming a carrier having a die attach region and an edge region, and a solder mask having one or more apertures on the edge region;
   b) attaching a semiconductor die to the die attach region of the carrier; and
   c) depositing solder in the one or more apertures in the solder mask,
   wherein the carrier comprises a base metal and wherein a) comprises
      i) depositing a solder wettable layer on the base metal,
      ii) depositing an oxidation barrier layer on the base metal,
      iii) depositing a photosensitive layer on the edge region, and
      iv) forming the solder mask from the deposited photosensitive layer.

9. The method of claim 1 wherein c) is performed before b).

10. The method of claim 1 wherein the semiconductor die comprises a vertical metal oxide semiconductor field effect transistor (MOSFET) device.

11. A method for forming a semiconductor die package, the method comprising:
   a) forming a carrier having a die attach region and a plurality of edge regions disposed around and at least partially defining the die attach region, wherein each edge region has a surface that is elevated with respect to the die attach region, and a first solder mask disposed on at least one of the plurality of edge regions;
   b) attaching a semiconductor die comprising a vertical power metal oxide field effect transistor (MOSFET) device having a source region, a drain region, and a gate region to the die attach region, and second solder mask with apertures, wherein the drain region of the semiconductor die is proximate to the die attach region and the source region is distal to the die attach region; and
   c) depositing solder in the apertures of the first solder mask and the apertures in the second solder mask substantially simultaneously.

12. The method of claim 11 further comprising:
   d) forming one or more layers of material on the base metal.

13. The method of claim 1 wherein the semiconductor die comprises a power MOSFET.

14. The method of claim 1 further comprising reflowing the deposited solder.

15. The method of claim 1 wherein the semiconductor die comprises a power MOSFET including a source region and a gate region distal to the die attach region and a drain region proximate to the die attach region.

16. The method of claim 15 further comprising depositing solder on the source region and the gate region.

17. The method of claim 1 further wherein the carrier comprises copper.

18. The method of claim 1 wherein the carrier comprises a base metal comprising copper and one or more underbump metallurgy layers on the base metal.

* * * * *